(12) United States Patent
Nadarajah et al.

(10) Patent No.: US 11,785,742 B2
(45) Date of Patent: Oct. 10, 2023

(54) MICROCHANNEL HEAT SINK FOR DATACENTER SOLID STATE DRIVES

(71) Applicant: WESTERN DIGITAL TECHNOLOGIES, INC., San Jose, CA (US)

(72) Inventors: Puurnaraj Nadarajah, Kedah (MY); Mutharasu Devarajan, Penang (MY)

(73) Assignee: Western Digital Technologies, Inc., San Jose, CA (US)

( * ) Notice: Subject to any disclaimer, the term of this patent is extended or adjusted under 35 U.S.C. 154(b) by 21 days.

(21) Appl. No.: 17/579,947

(22) Filed: Jan. 20, 2022

(65) Prior Publication Data

US 2023/0232575 A1 Jul. 20, 2023

(51) Int. Cl.
*H05K 7/20* (2006.01)
*F28D 21/00* (2006.01)

(52) U.S. Cl.
CPC ......... *H05K 7/20254* (2013.01); *F28D 21/00* (2013.01); *F28D 2021/0029* (2013.01); *H05K 7/20772* (2013.01)

(58) Field of Classification Search
CPC ............ H05K 7/20254; H05K 7/20772; F28D 2021/0029; F28F 3/12; F28F 2260/02; H01L 23/473
See application file for complete search history.

(56) References Cited

U.S. PATENT DOCUMENTS

| 6,983,792 | B2 * | 1/2006 | Dickey | H01L 23/473 |
| | | | | 257/E23.098 |
| 9,891,006 | B2 * | 2/2018 | Meng | H01L 23/3675 |
| 10,485,143 | B2 * | 11/2019 | Gao | H05K 7/20781 |
| 10,827,649 | B2 * | 11/2020 | Lunsman | H05K 7/20927 |
| 11,015,872 | B2 * | 5/2021 | Aston | H01L 23/473 |
| 2019/0141861 | A1 * | 5/2019 | Shedd | F28F 13/02 |

* cited by examiner

*Primary Examiner* — Zachary Pape
(74) *Attorney, Agent, or Firm* — Vierra Magen Marcus LLP

(57) ABSTRACT

A heat sink for use in drawing heat away from electronic devices such as solid state drives (SSDs) includes microchannels formed along its length. The microchannels may have a triangular cross-section and may be formed by additive manufacturing. Two pairs of microchannels are provided, with coolant fluid running in a first direction through the first pair, and in a second opposite direction in the second pair to minimize thermal gradients along the length of the SSD and heat sink. The walls of the microchannel may be formed with a roughness that provides turbulent flow through the microchannels. The turbulent flow together with the large surface area of the three sides of the triangular microchannels increases the heat transfer coefficient of the microchannels, while the triangular shape and pumping fluid through a pair of microchannels reduces pressure drop along the microchannels.

18 Claims, 14 Drawing Sheets

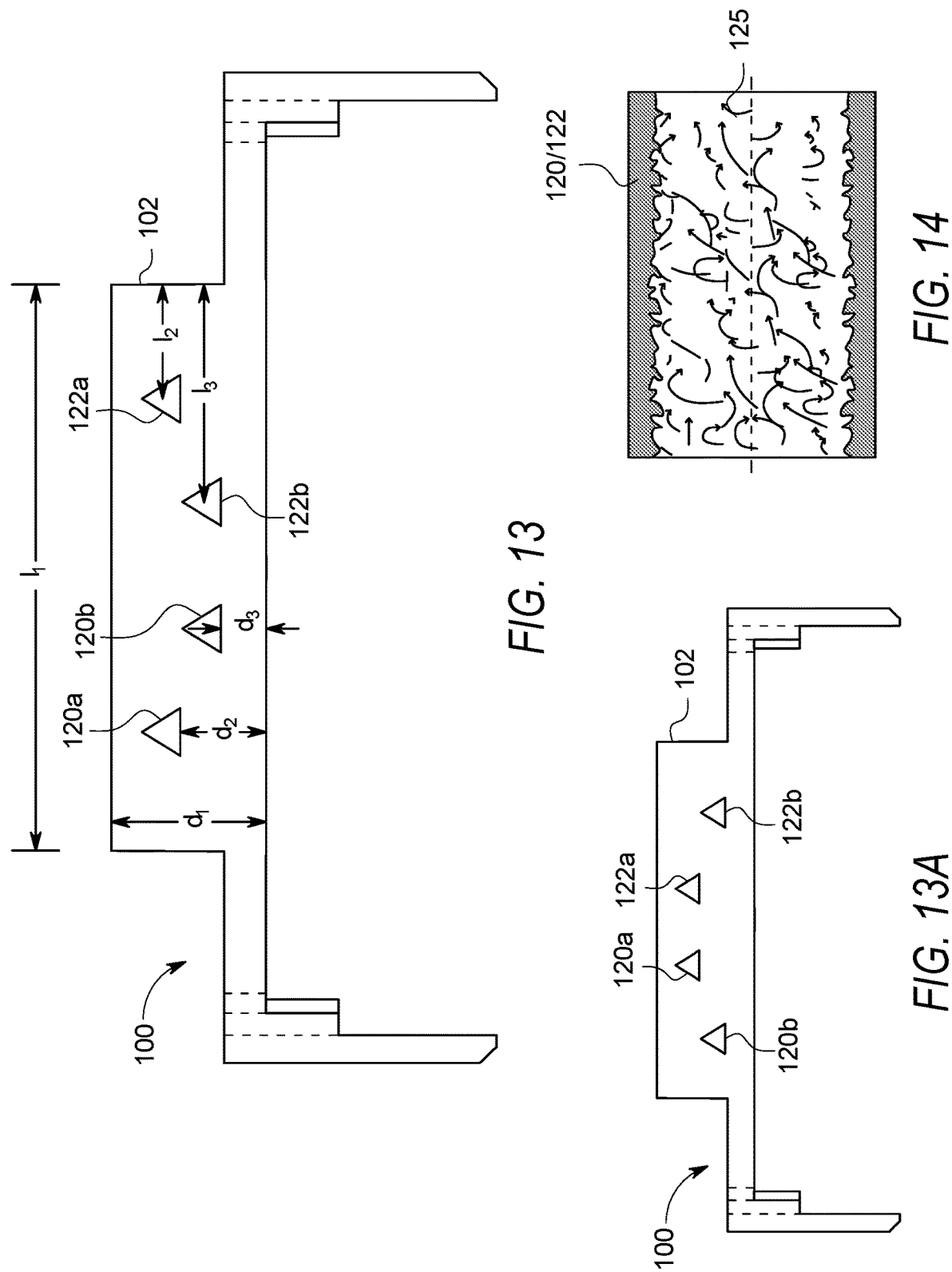

MICROCHANNEL HEAT SINK FOR DATACENTER SOLID STATE DRIVES

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Given the advantages of non-volatile memory devices, there is currently a push to use them as solid state drives (SSDs) in enterprise datacenters in the place of traditional hard disk drives (HDDs). In particular, because SSDs store data electronically and do not require the mechanical interface of an HDD, SSDs can read and write data more quickly than HDDs. Another feature of the electronic versus mechanical interface is that SSDs tend to last longer, and use less power for read/write operations.

The amount of data that is being generated on a daily basis is growing rapidly, placing more and more demand on datacenters. With advances in SSD technology, SSD storage capacity has now surpassed HDD storage capacity, and SSDs are scaling at a faster rate than HDDs. However, meeting data demands in enterprise datacenters remains a constant problem. One challenge provided by increased data demands is how to prevent overheating of datacenter memory drives. Traditionally, datacenters have used forced convection air-cooling, circulating conditioned air through the datacenter to draw heat away from the drives. However, the concentrated use of SSDs generates a large amount of heat in a closed space, and air-cooling has reached its effective limit.

It is known also known to liquid cool datacenter SSDs. Immersion cooling involves submerging SSDs in a cooled liquid bath. While effective, this type of cooling is in an early phase of development, and the long-term effects of submerging electronic components in coolant are relatively unknown. It is also known to use a cold plate mounted on SSDs, including forming fluid-flow channels through the plate. However, such plates have conventionally had a low thermal transfer coefficient to pressure drop ratio, partly due to the difficulty in manufacturing the channels to desired specifications. The inability to efficiently cool enterprise datacenter SSDs limits the operational capabilities of such drives.

DESCRIPTION OF THE DRAWINGS

FIG. 13 is a cross-sectional front view of a microchannel heat sink according to embodiments of the present technology.

FIG. 13A is a cross-sectional front view of an alternative microchannel heat sink according to embodiments of the present technology.

FIG. 14 is a cross-sectional view of a microchannel of the heat sink according to embodiments of the present technology.

DETAILED DESCRIPTION

Figure 1:
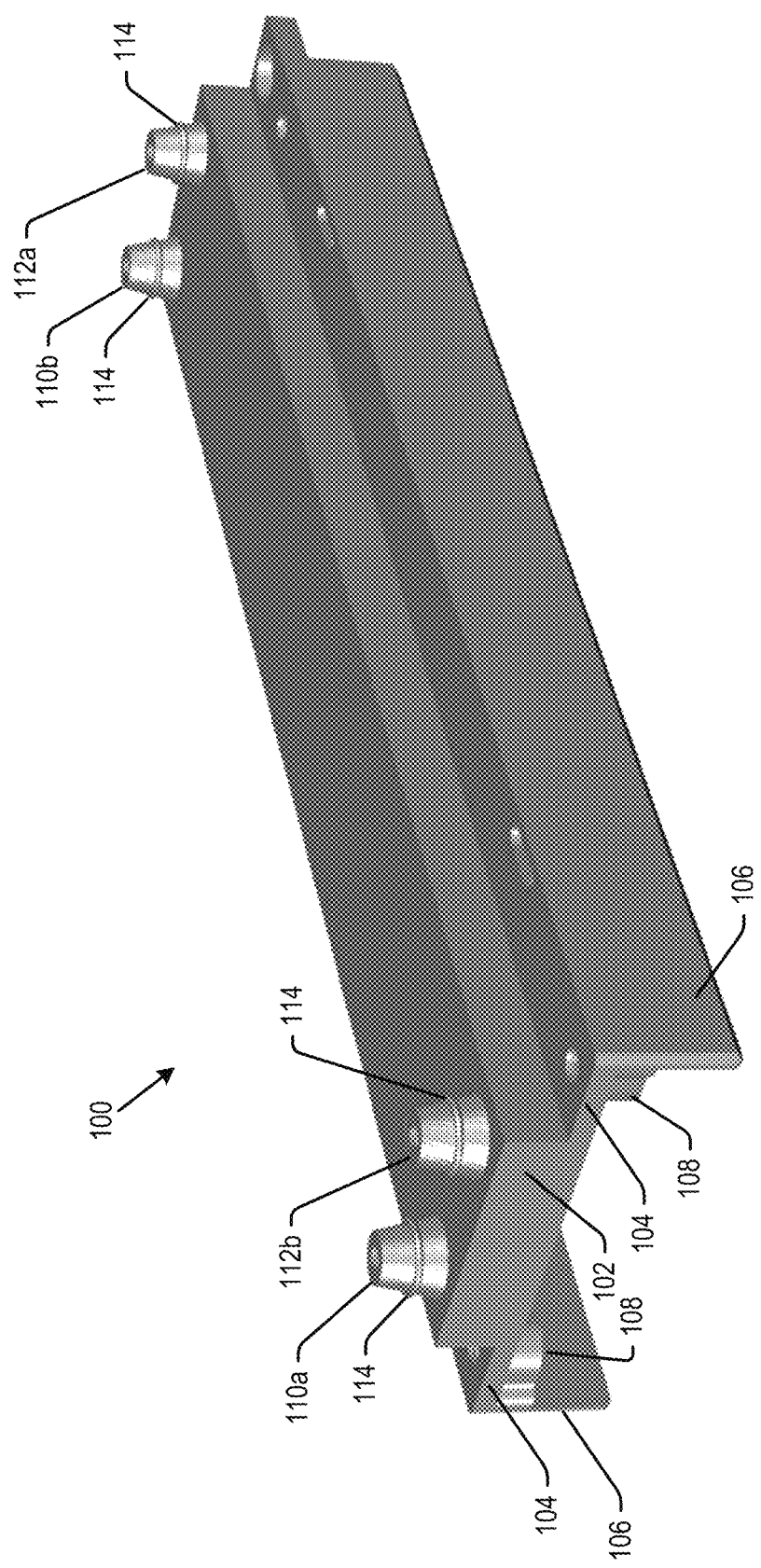
FIGS. 1 and 2 are different top perspective views of a microchannel heat sink according to embodiments of the present technology.

The present technology will now be described with reference to the figures, which in embodiments, relate to a heat sink configured to mount to an electronic device such as a solid state drive (SSD) in an datacenter. The heat sink includes a pair of opposed interior fluid flow paths, each including an inlet and an outlet through which a cooling fluid enters and exits the heat sink. The inlet and outlet of each fluid flow path are connected by a pair of stacked interior microchannels. Fluid travels between the inlet and outlet of the first fluid flow path in a first direction through a first stacked pair of microchannels. Fluid travels between the inlet and outlet of the second fluid flow path in a second direction, opposite the first, through a second stacked pair of microchannels. Having fluid flow through the heat sink in two directionally-opposed flow paths minimizes thermal gradients along the length of the heat sink and SSD. The heat sink may be fabricated by additive manufacturing which enables the intricate shape of the inlets, outlets and microchannels.

The walls of each interior microchannel may be formed with a triangular cross-section, and with a roughness that may provide turbulent flow through the microchannel. The turbulent flow together with the large surface area of the three-sided, triangular microchannel increases the heat transfer coefficient of the microchannels, maximizing heat transfer away from the SSD through the heat sink. At the same time, the provision of a pair of stacked microchannels between each inlet and outlet reduces pressure drop through the microchannels, thus minimizing the pumping power required to circulate the cooling fluid.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In embodiments, the acceptable manufacturing tolerance is ±0.15 mm, or alternatively, ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

Figure 2:
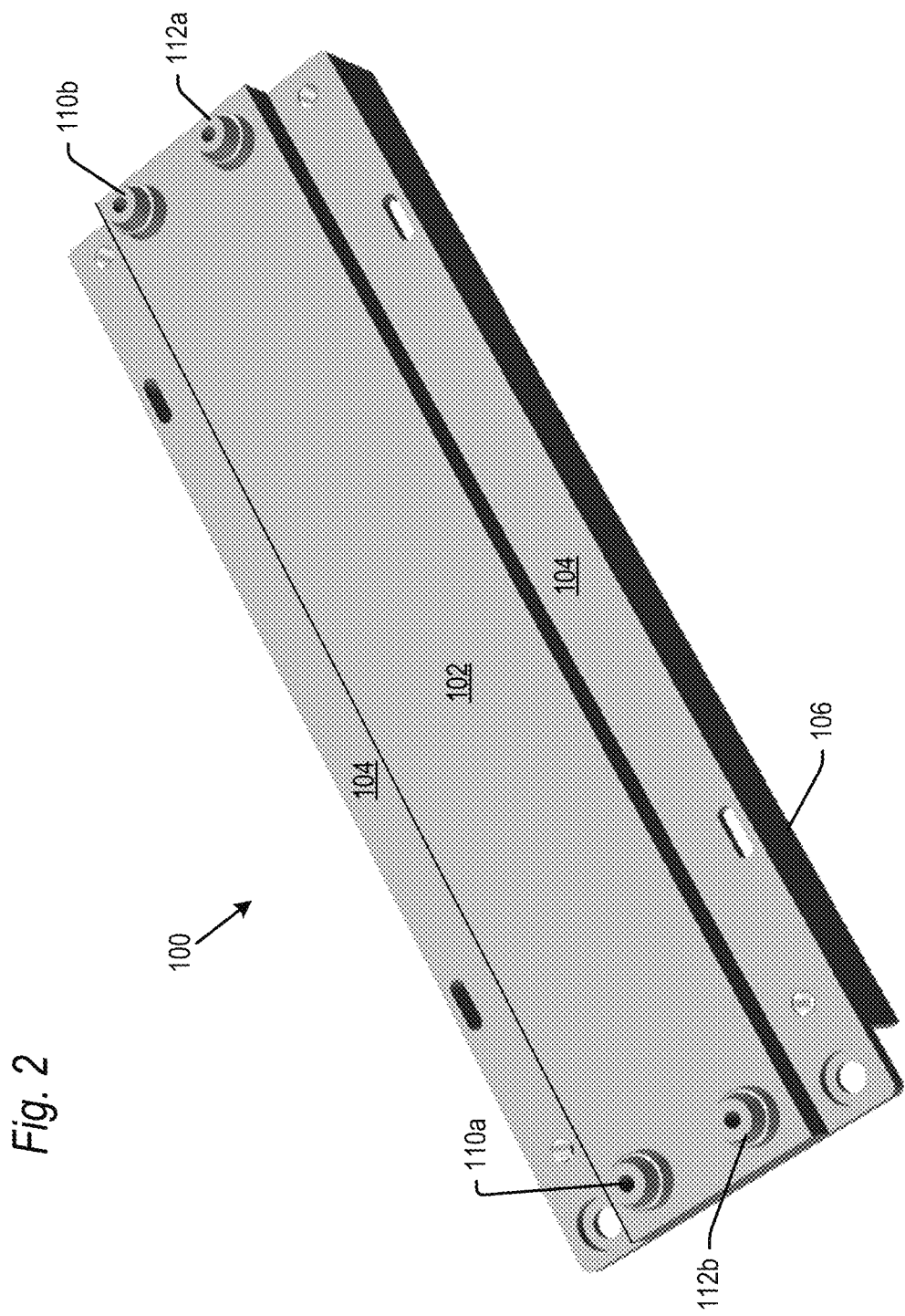
Figure 3:
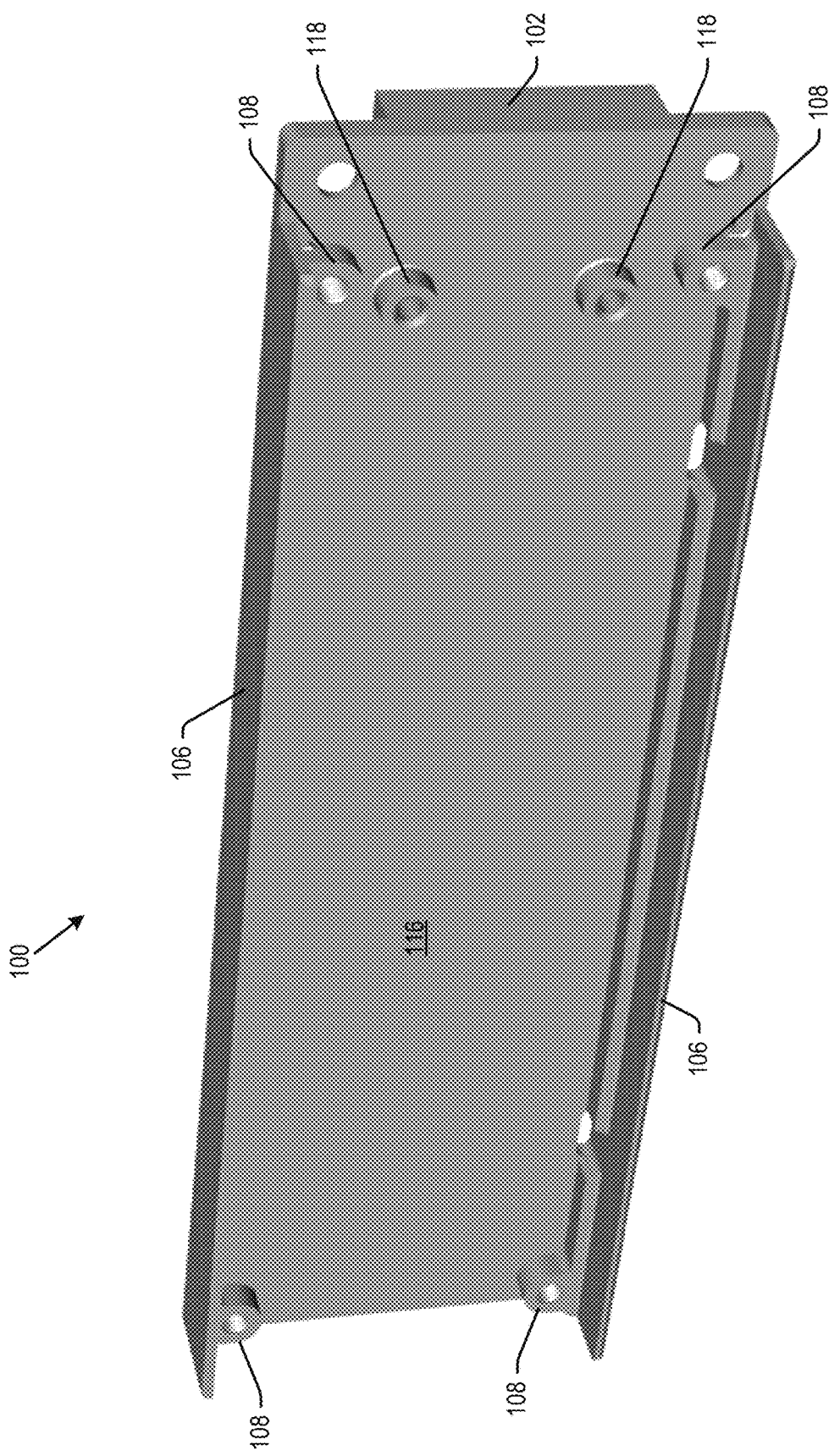
FIG. 3 is a bottom perspective view of a microchannel heat sink according to embodiments of the present technology.
Figure 4:
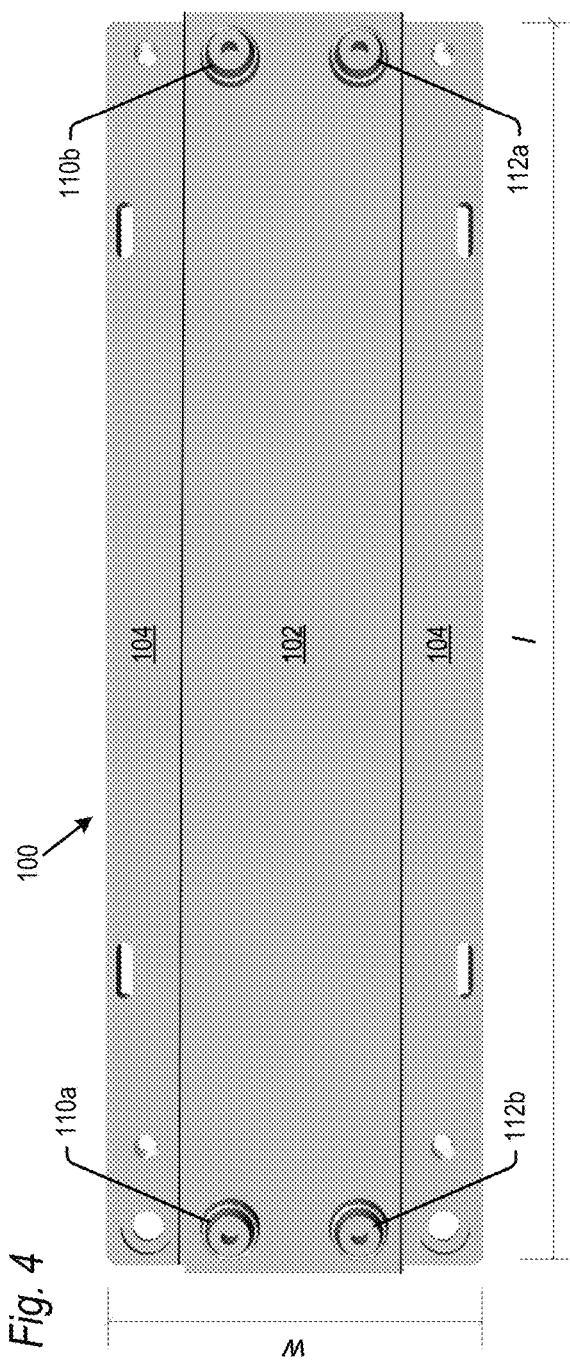
FIG. 4 is a top planer view of a microchannel heat sink according to embodiments of the present technology.
Figure 5:
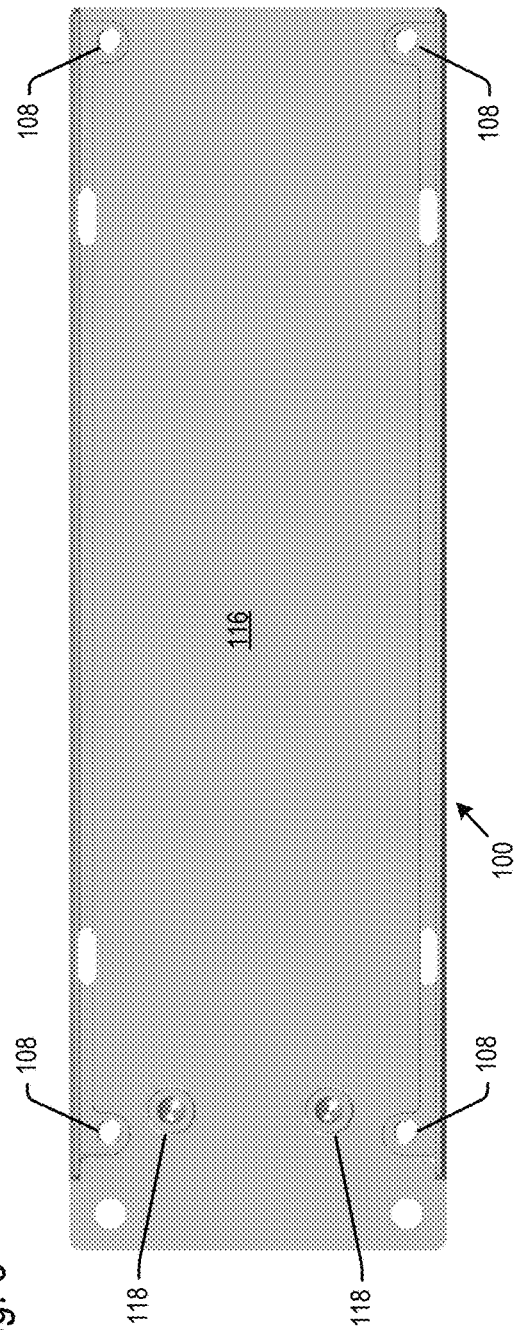
FIG. 5 is a bottom planer view of a microchannel heat sink according to embodiments of the present technology.
Figure 6:
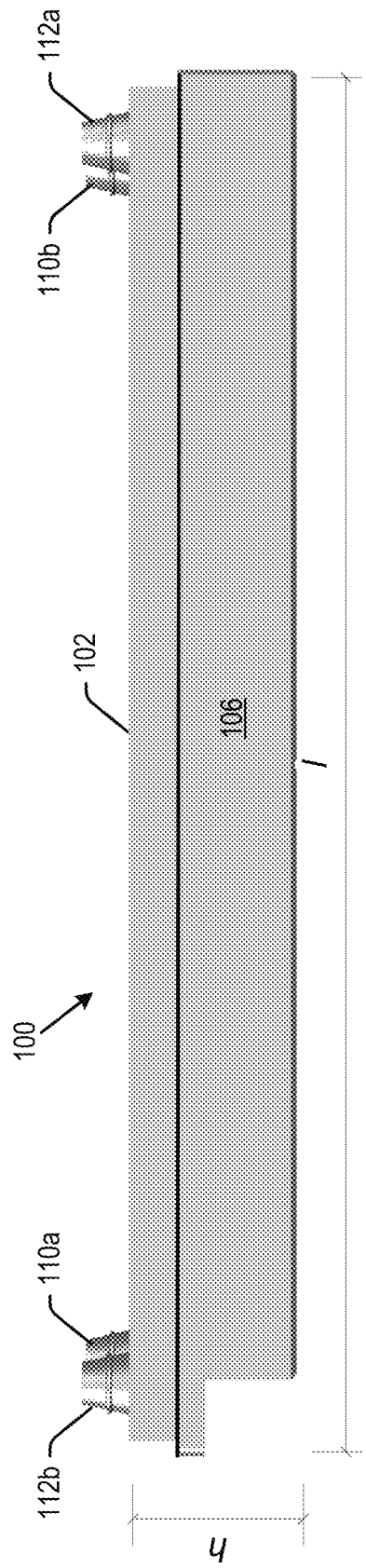
FIG. 6 is an edge view of a microchannel heat sink according to embodiments of the present technology.
Figure 7:
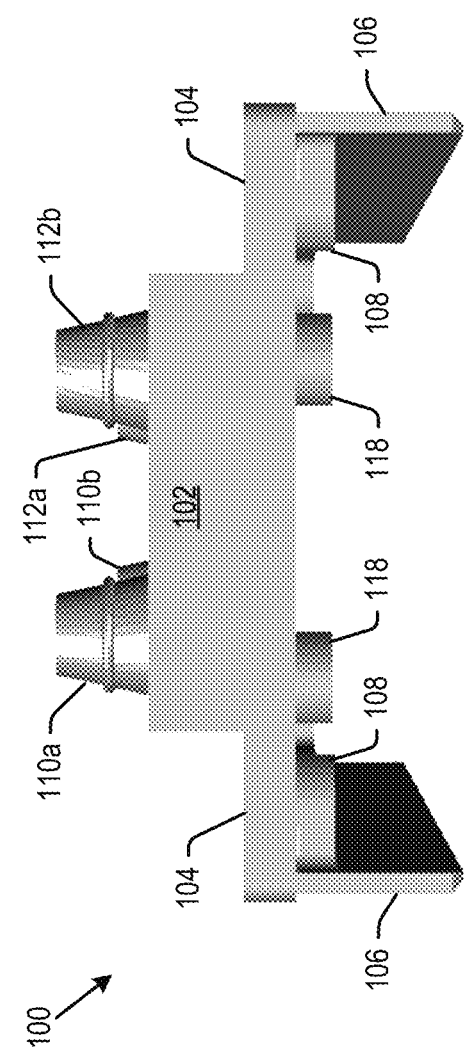
FIG. 7 is a front view of a microchannel heat sink according to embodiments of the present technology.
Figure 8:
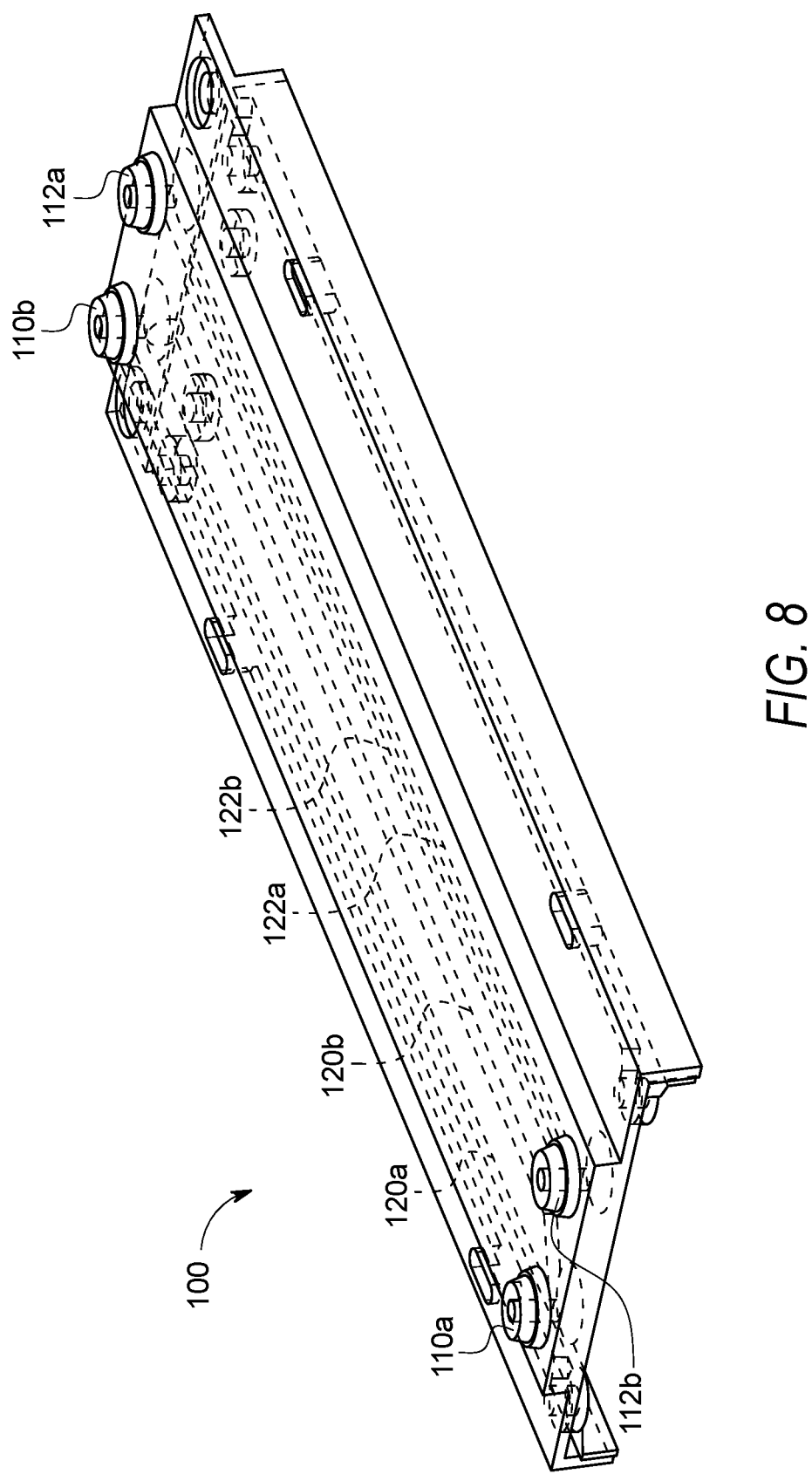
FIG. 8 is a top phantom perspective view of a microchannel heat sink according to embodiments of the present technology.
Figure 9:
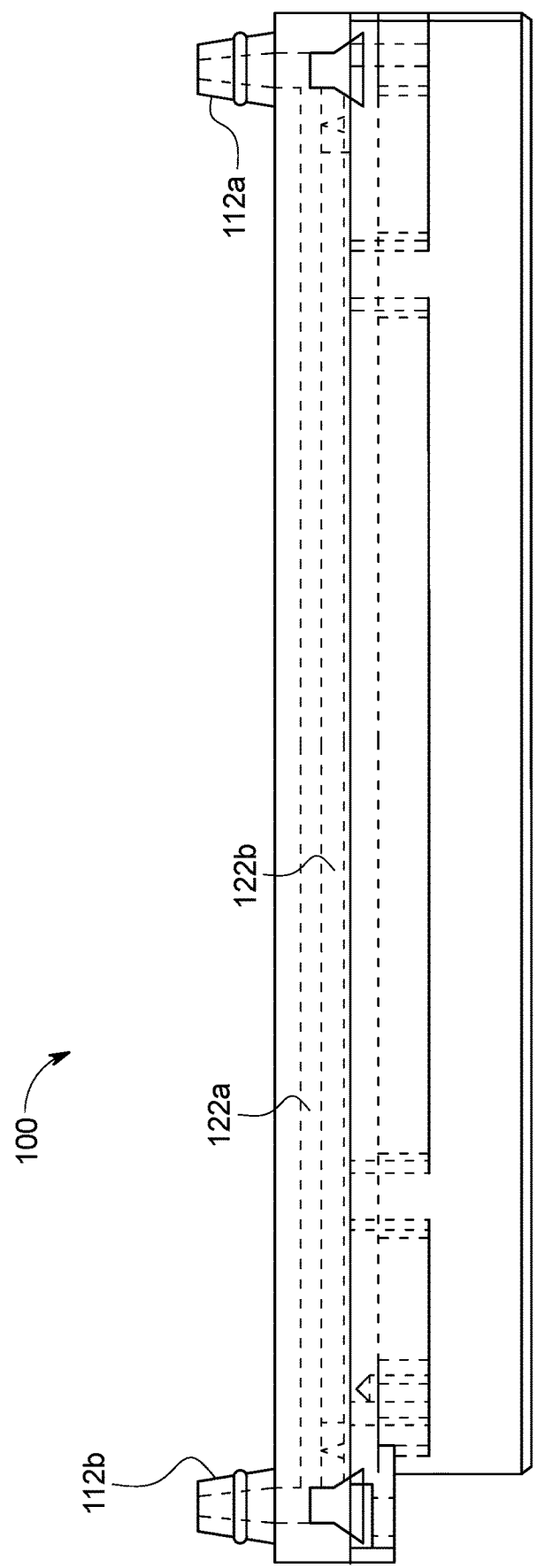
FIG. 9 is a phantom edge view of a microchannel heat sink according to embodiments of the present technology.

An embodiment of the present technology will now be explained with reference to the perspective, top, bottom, front, edge and cross-sectional views of FIGS. 1-14 and 17-19, and the graphs of FIGS. 15 and 16. FIGS. 1 and 2 are views of a heat sink 100 shown at two different top perspectives and FIG. 3 is a view of heat sink 100 from a bottom perspective. FIGS. 4 and 5 show top and bottom planar views of the heat sink 100. And FIGS. 6 and 7 show edge and front views of the heat sink 100. The heat sink 100 may be a monolithic design including a length, l, width, w and height, h. In one example, the dimensions of the heat sink 100 may be 111 mm (l)×19 mm (w)×6 mm (h), but it is understood that each of these dimensions may vary in further embodiments.

The heat sink 100 may include a microchannel base 102 formed integrally with side portions 104 and downwardly extending ribs 106. The ribs 106 are spaced apart from each other a distance to accept an SSD or other electronic device snugly therebetween, and the distance between the ribs (and width, w, of the heat sink) may vary depending on the width of the electronic device. The heat sink 100 may further include mounting brackets 108 formed in the side portions 104, which brackets 108 are configured to receive screws to mount the heat sink against a surface of an electronic device as explained below with reference to FIGS. 17-19. The position of the mounting brackets 108 is by way of example, and the position may vary in further embodiments.

The heat sink 100 may include a first inlet fitting and outlet fitting pair 110a and 110b on a top surface of the microchannel base 102. The heat sink 100 may further include a second inlet fitting and outlet fitting pair 112a and 112b on a top surface of the microchannel base 102. The first inlet 110a is coupled to the first outlet 110b by microchannels 120 formed through the microchannel base 102 as explained below. The second inlet 112a is coupled to the second outlet 112b by microchannels 122 formed through the microchannel base 102 as explained below.

As shown, the inlet/outlet fitting pair 110a, 110b are positioned oppositely from the inlet/outlet fitting pair 112a, 112b. Each inlet/outlet fitting 110, 112 may be formed as an upwardly extending conical member having a base on the microchannel base 102 which tapers as the conical member extends upward away from the base. The conical shape of the inlets/outlet fittings is configured to allow tubing carrying the cooling fluid to be connected over the inlets/outlets, where the tubing may be tightened gradually upon being pushed towards the microchannel base 102. An O-ring 114 may be formed along the length of each of the inlets/outlet fittings for tight/leak proof connection between tubing and the inlets/outlets. O-ring 114 may be omitted in further embodiments.

The heat sink 100 may include a bottom surface 116 (FIGS. 3, 5 and 7) configured to rest against a surface of the electronic device when the heat sink is affixed to the electronic device by screws that fit within the brackets 108. Guides 118 are used to facilitate mounting of the heat sink 100 onto an electronic device during assembly. In embodiments, the heat sink may be formed of aluminum, an aluminum alloy such as Al—Si—Mg, copper, copper alloy or other high thermal conductivity material that provides minimal thermal conduction resistance between microchannel base 102 and the microchannels.

Figure 10:
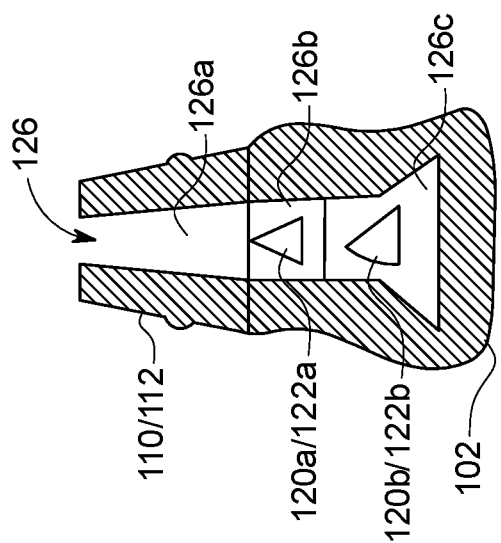
FIG. 10 is a cross-sectional view of an inlet/outlet fitting in the microchannel base according to embodiments of the present technology.

FIGS. 8, 9, 11 and 12 are phantom perspective, edge, front and top views, respectively, of the heat sink 100, and FIG. 10 is a cross-sectional view, each illustrating the microchannels 120, 122 formed internally within the microchannel base 102. The microchannels comprise first, second, third and fourth microchannels. The first pair of inlet/outlet fittings 110 include the first and second stacked microchannels 120a and 120b extending between and connecting the inlet 110a and outlet 110b. The second pair of inlet/outlet fittings 112 include the third and fourth stacked microchannels 122a and 122b extending between and connecting the inlet 112a and outlet 112b.

FIG. 10 shows a cross-sectional view through an inlet/outlet fitting 110, 112 and a portion of the microchannel base 102. Each of the inlets/outlet fittings 110, 112 may have this configuration. Each inlet/outlet fitting may have a median thickness of 4 mm, with a top diameter of 3.5 mm and bottom as 5.25 mm, but each of these dimensions may vary in further embodiments. As shown in FIG. 10, there is an opening 126 defined within each inlet/outlet fitting which extends down into the microchannel base 102, through which opening the cooling fluid enters and exits the heat sink 100. The opening 126 has a first, conical portion 126a which extends conically down through a center of the inlet/outlet, getting slightly wider toward the microchannel base 102. The first portion 126a of opening 126 connects with a second, cylindrical portion 126b extending through a portion of the microchannel base. The second portion 126b in turn connects with a third, conical portion 126c which extends conically down further into the microchannel base 102, getting wider toward its bottom. The internal diameter of opening 126 at the first portion 126a may be 1.5 mm at the top, and the internal diameter of opening 126 at portion 126c may enlarge to 2.5 mm at bottom.

As shown in FIGS. 8-11, the microchannel 120a of the first stacked pair of microchannels is at a first depth down into the microchannel base, and the microchannel 120b of the first stacked pair of microchannels is at a second depth down into the microchannel base, with the second depth being greater than the first depth. The same is true of microchannels 122a and 122b of the second stacked pair of microchannels 122.

The upper microchannels 120a, 122a are substantially straight and parallel to an upper surface of the microchannel base 102. The upper microchannel 120a connects with the opening 126 in each of the inlet fittings 110a and 110b so that the cooling fluid can be pumped into the inlet fitting 110a, flow through the upper microchannel 120a and exit the outlet fitting 110b. Likewise, the upper microchannel 122a connects with the opening 126 in each of the inlet fittings 112a and 112b so that the cooling fluid can be pumped into the inlet fitting 112a, flow through the upper microchannel 122a and exit the outlet fitting 112b.

Figure 11:
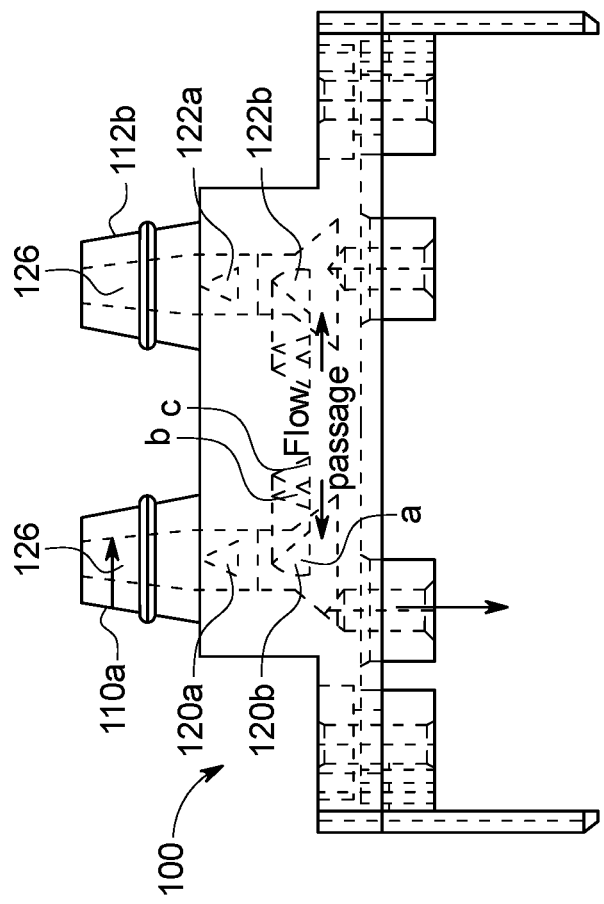
FIG. 11 is a front phantom view of a microchannel heat sink according to embodiments of the present technology.
Figure 12:
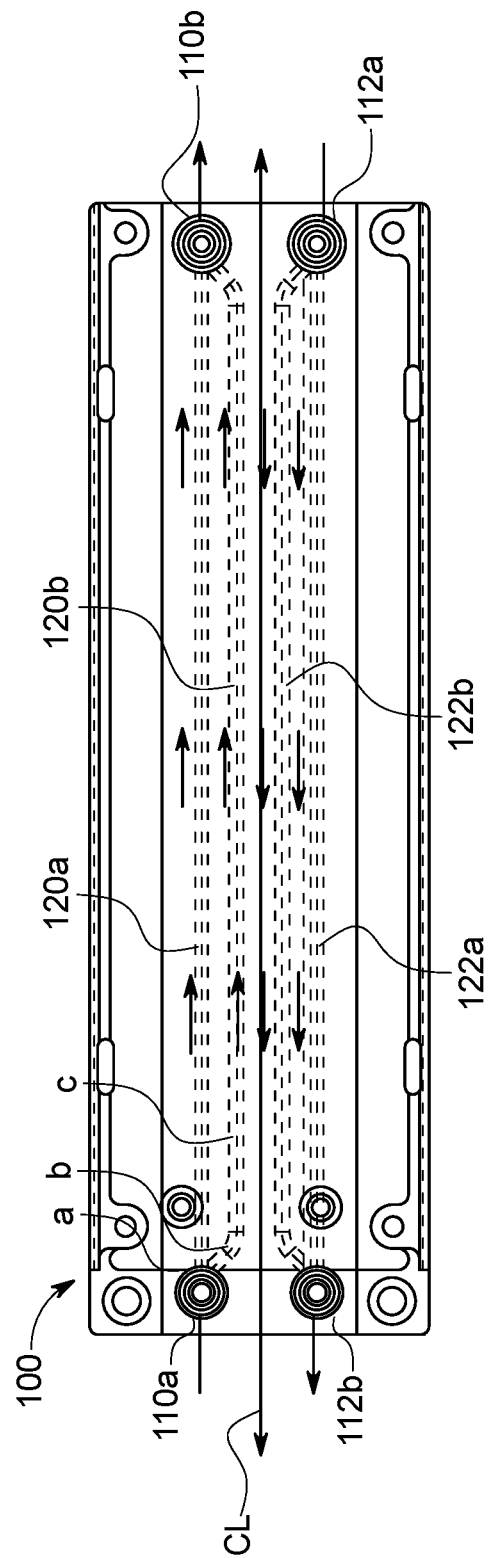
FIG. 12 is a top phantom view of a microchannel heat sink according to embodiments of the present technology.

As shown in FIGS. 11 and 12, the lower microchannels 120b, 122b angle inward toward each other from their connections at the inlet/outlet fittings 110, 112 toward a longitudinal centerline CL (FIG. 12) of the heat sink 100. Thus, for example, the microchannel 120b connects with opening 126 of inlet fitting 110a at position "a" shown in FIGS. 11 and 12. As explained below, each microchannel 120, 122 has a triangular cross-section, but it projects otherwise at position "a" in FIGS. 10 and 11 giving the intersection of the triangular microchannel with the cylindrical and/or conical opening 126. From position "a," the microchannel 120b extends inward along its length toward a longitudinal centerline of the microchannel base (position "b" in FIGS. 11 and 12) to a final position "c" in FIGS. 11 and 12. Once at position "c," microchannel 120b extends substantially straight along the length of the microchannel base 102, until it again angles outward away from the longitudinal centerline at the outlet fitting 110b. Microchannel 122b has the mirror shape. The lower microchannels 120b, 122b reside in a horizontal plane (parallel to the surface of microchannel base 102).

The lower microchannel 120b connects with the opening 126 in each of the inlet fittings 110a and 110b so that the cooling fluid can be pumped into the inlet fitting 110a, flow through the lower microchannel 120b and exit the outlet fitting 110b. Likewise, the lower microchannel 122b connects with the opening 126 in each of the inlet fittings 112a and 112b so that the cooling fluid can be pumped into the inlet fitting 112a, flow through the lower microchannel 122b and exit the outlet fitting 112b.

The upper and lower microchannels 120a, 122a, 120a and 120b have been described above as being parallel to the surface of the microchannel base 102 and extending straight across (lower microchannels 120b and 122b extending straight across at position c). However, it is understood that the microchannels may extend along non-parallel and/or non-straight paths through the microchannel base in further embodiments. For example, the upper and/or lower microchannels may slant upward or downward from the inlet to the outlet. As a further example, instead of being straight, the microchannels may have a sinusoidal, triangular, rectangular or other shape, in a plane parallel and/or perpendicular to the surface of the microchannel base, as they extend between the inlet and outlet fittings.

In embodiments, each of the microchannels 120a, 122a, 120a and 120b are independent and do not intersect with each other. However, in a further embodiment, the upper and lower microchannels 120a and 120b may intersect (open up to each other) along their lengths. In a further embodiment, the upper and lower microchannels 122a and 122b may intersect along their lengths.

In embodiments described above, the upper microchannels 120a, 122a extend straight across the length of the microchannel base 102, and the lower microchannels 120b, 122b bend inward toward each other from the inlet and outlet fittings (positions "a," "b" and "c" of FIGS. 11 and 12). In a further embodiment shown in FIG. 13A, this may be reversed. In FIG. 13A, the lower microchannels 120b, 122b extend straight across the length of the microchannel base 102, and the upper microchannels 120a, 122a bend inward toward each other from the inlet and outlet fittings (positions "a," "b" and "c" of FIGS. 11 and 12).

The monolithic heat sink 100, including the inlet fittings 110a, 112a, outlet fittings 110b, 112b and microchannels 120, 122 of the above-described embodiments, would be difficult or impossible to fabricate using traditional methods. If feasible at all, such methods involve a combination of, for example, casting, extrusion, drilling, etching and/or electrical discharge machining (EDM), resulting in a long, complex and expensive manufacturing process. However, in accordance with aspects of the present technology, the heat sink 100 may be formed in a single step by additive manufacturing. The heat sink 100 may be formed by additive manufacturing using a selective laser melting (SLM) method or a direct metal laser sintering (DMLS) method. Other additive manufacturing methods may be used. Fabricating the heat sink 100 by additive manufacturing makes the intricate shapes of the components, inlets/outlet fittings and microchannels of the heat sink 100 achievable. Additionally, all of the components of the heat sink are printed in a single additive manufacturing process. As such all components are formed and interconnected simply and quickly, with little or no additional fabrication or tooling.

As noted above, in embodiments, the cross-sectional area of each of the microchannels 120a, 122a, 120a and 120b may be triangular, as shown for example in the cross-sectional view of FIG. 13. FIG. 13 shows the dimensions of the microchannel base 102, and the positions of the triangular microchannels 120, 122 in the microchannel base 102. In one example, the microchannel base may have a length and depth of 20 mm ($l_1$)×7.5 mm ($d_1$). The upper microchannels 120a, 122a may be spaced 4.5 mm ($d_2$) from a bottom surface of microchannel 102, and the lower microchannels 120b, 122b may be spaced 2.5 mm ($d_3$) from the bottom surface of microchannel 102. The upper microchannels 120a, 122a may be spaced 4 mm ($l_2$) from a sidewall of microchannel 102, and the lower microchannels 120b, 122b may be spaced 7.5 mm ($l_3$) from the sidewall of microchannel 102. Each of these dimensions is by way of example and may vary in further embodiments.

The triangular cross-sections of each microchannel 120a, 120b, 122a and 122b may be identical to each other and may be equilateral or isosceles triangles. However, the cross-sections of the upper and lower microchannels of each stacked pair may be different from each other, and may be other triangular shapes in further embodiments. In embodiments, the triangular cross-section of each microchannel is oriented so that a flat side of the triangle is parallel to the surface of the microchannel base along the entire length of the microchannel, and this flat side forms the bottommost portion of the triangular cross-section. The triangular cross-section of each microchannel may have other orientations in further embodiments, and may rotate on itself in a helical pattern along some or all of the length of the microchannel in further embodiments.

In embodiments, each triangular microchannel 120, 122 may have a width at its base of between 0.8 mm to 1.3 mm, and a height of between 0.75 mm to 1.1 mm. These dimensions are by way of example only and may vary in further embodiments. The characteristic length of each triangular cross-section microchannel is its hydraulic diameter, which is between 0.5 mm to 0.8 mm. Again, these values may vary in further embodiments.

The microchannels 120, 122 have characteristics which increase their heat transfer coefficient as compared to traditional microchannels. First, the triangular cross-section microchannel is more efficient at transferring heat than conventional circular and the hybrid teardrop microchannels. In particular, the heat transfer coefficient of a triangular channel is increased relative to other designs due to presence of a large surface area of the three edges of the cross section. This creates increased contact of the fluid with channel walls and may cause recirculation/eddy flow which contributes to enhanced heat transfer coefficient.

Additionally, as shown in FIG. 14, the microchannels 120, 122 are printed with a desired wall roughness. In embodiments, this roughness may be approximately 3-25 μm. The rough walls may provide turbulent flow and flow mixing of the cooling fluid 125 as it moves through the microchannels. This turbulent flow and flow mixing further increases surface to fluid volume ratio of the microchannels thus further improving the heat transfer coefficient.

Figure 15:
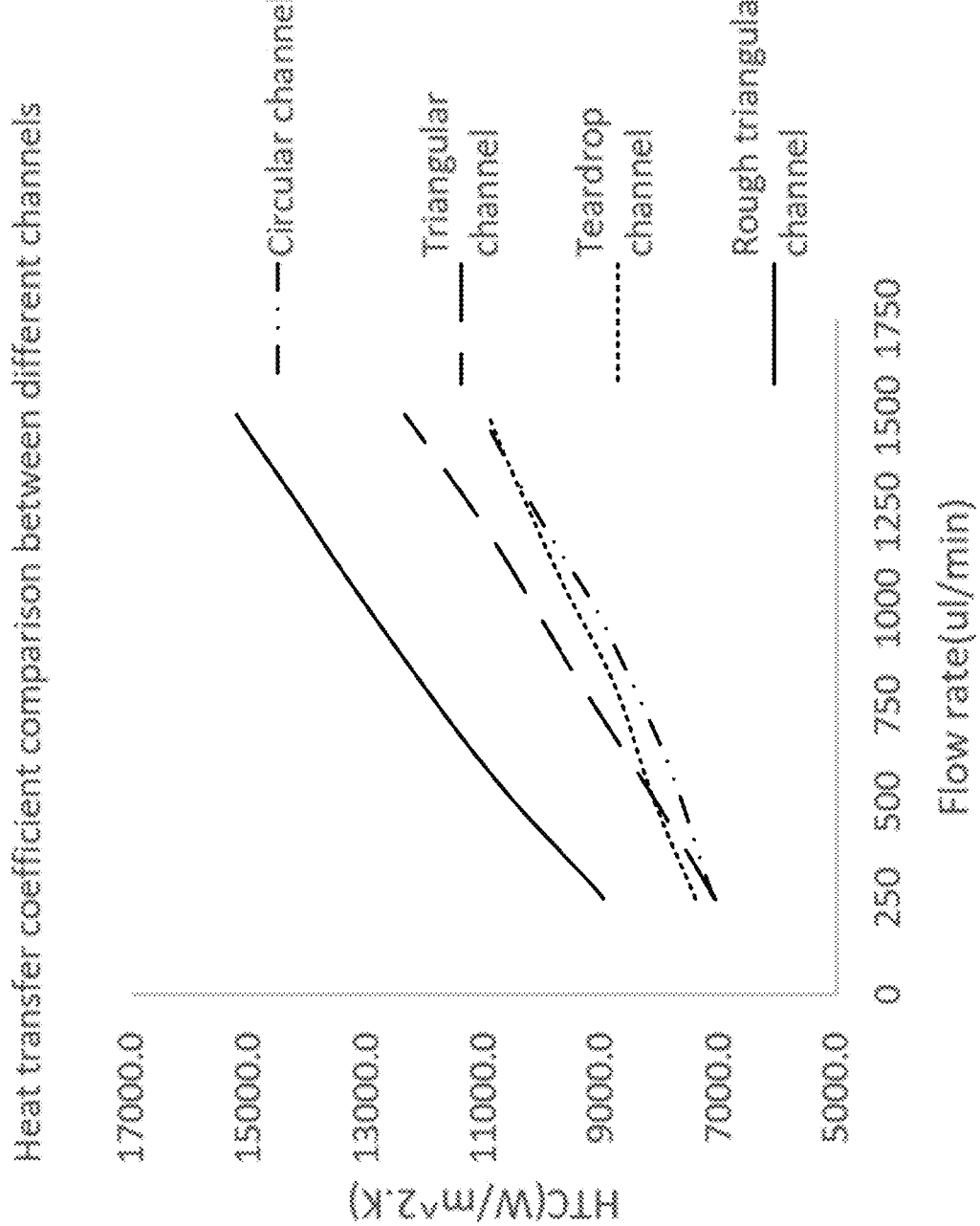
FIG. 15 is a graph showing heat transfer coefficients of different shaped microchannels.

The flowchart of FIG. 15 shows a comparison for heat transfer coefficients for different types of channels. As seen, the above microchannel design characteristics (triangular cross section and rough walls) increases heat transfer coefficient of microchannel by 15-20% as compared to conventional microchannel designs. These other microchannel designs include a circular channel, a smooth triangular channel, a teardrop channel.

It is a further feature of the present technology to reduce the pressure drop through the microchannels of the present technology as compared to conventional channels. Pressure drop occurs due to shear stress against the side walls of a channel, which slows down the cooling fluid as it passes along the microchannel. High pressure drops require more pumping power and a large strain on overall power requirements of the datacenter to cool the memory devices. In accordance with the present technology, pressure drop along the microchannels 120, 122 is minimized. One reason is that the triangular microchannel reduces shear stress between fluid and microchannel walls. This is achieved as triangular microchannels have an increased cross section dimension despite having identical hydraulic diameter as compared to other channels mentioned above. Therefore, as can be seen from Equation 1 below for pressure drop, Δp, for the same flow rate (qv), an increase in microchannel cross-section (A) decreases pressure drop:

$$\Delta p = \frac{\rho}{2}\left[\frac{qv}{C_D \times A}\right]^2. \quad \text{(Eq. 1)}$$

In addition, the provision of top and bottom stacked microchannels enables flow rate to be segregated into two microchannels. This further reduces pressure drop as flow rate is divided between a pair of microchannels.

Figure 16:
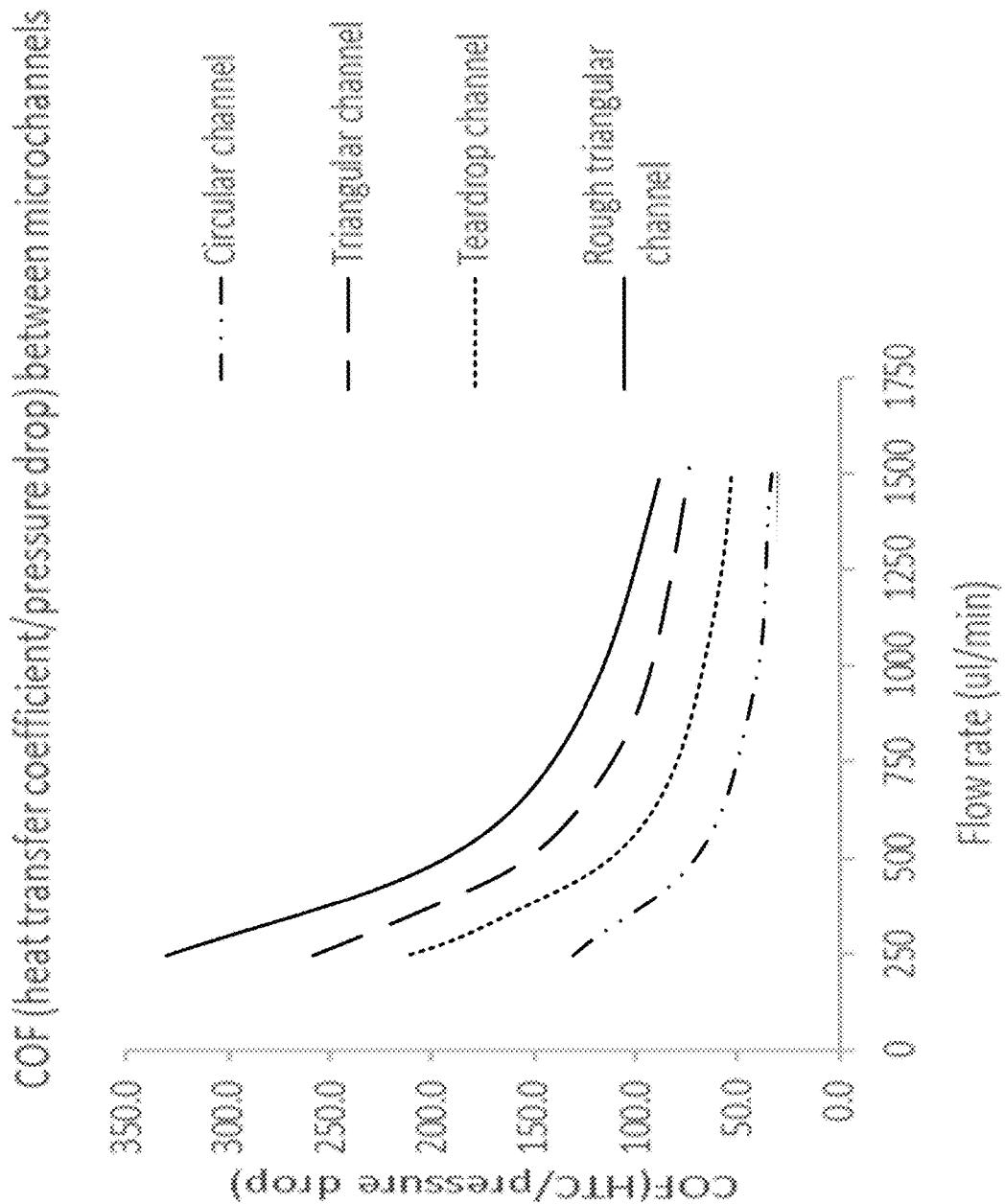
FIG. 16 is a graph showing heat transfer coefficient versus pressure drop for different shaped microchannels.

FIG. 16 is a graph of the ratio of heat transfer coefficient (HTC) to pressure drop between different types of microchannels. Ideally, the ratio is high, as it is desirable to maximize HTC while minimizing pressure drop. As seen in FIG. 16, the ratio of HTC to pressure drop for rough walled triangular microchannels is up to 50% higher than conventional microchannels. The increase in heat transfer coefficient and the reduction in pressure drop provided by the microchannels of the present technology provides a marked improvement in overall efficiency/performance as compared to conventional channels.

It is a further feature of the present technology to reduce thermal stresses within the heat sink and the attached electronic device. As noted above and as shown for example in FIG. 12, The present technology employs a first fluid flow path where fluid enters inlet 110a, flows to the right (from the perspective of FIG. 12) and exits outlet 110b having drawn heat out of the heat sink. The present technology also employs a second fluid flow path, opposed to the first, where fluid enters inlet 112a, flows to the left (from the perspective of FIG. 12) and exits outlet 112b having drawn heat out of the heat sink. These crossflow paths ensure uniform temperature distribution along the heat sink resulting in reduced thermal stress in the heat sink and attached electronic device.

Figure 17:
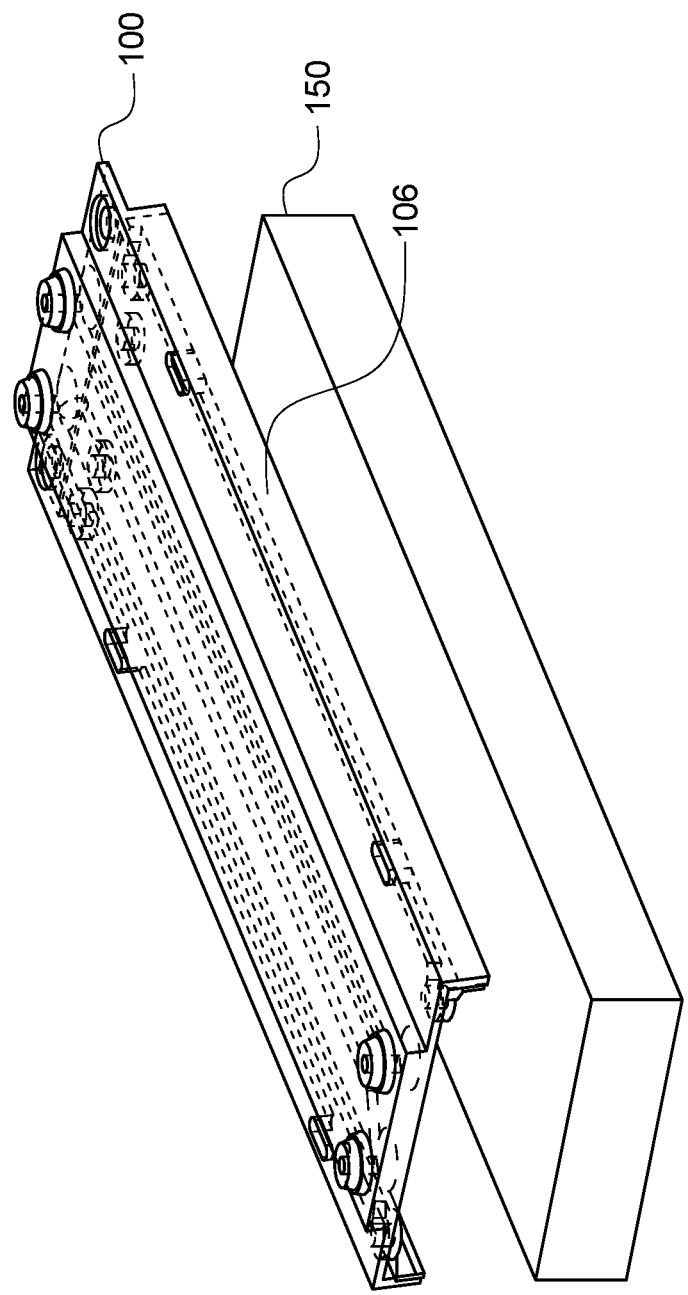
FIG. 17 is an exploded top perspective view of a microchannel heat sink and SSD according to embodiments of the present technology.
Figure 19:
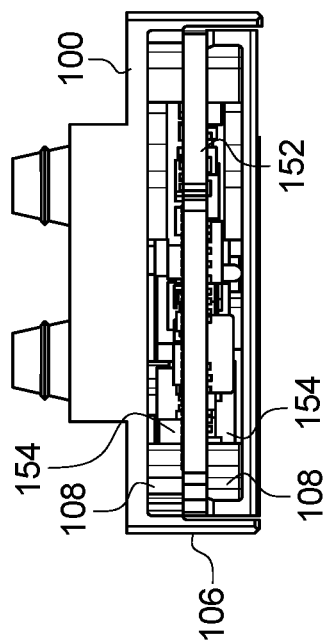
FIG. 19 is a front view of a microchannel heat sink and SSD according to embodiments of the present technology.
Figure 18:
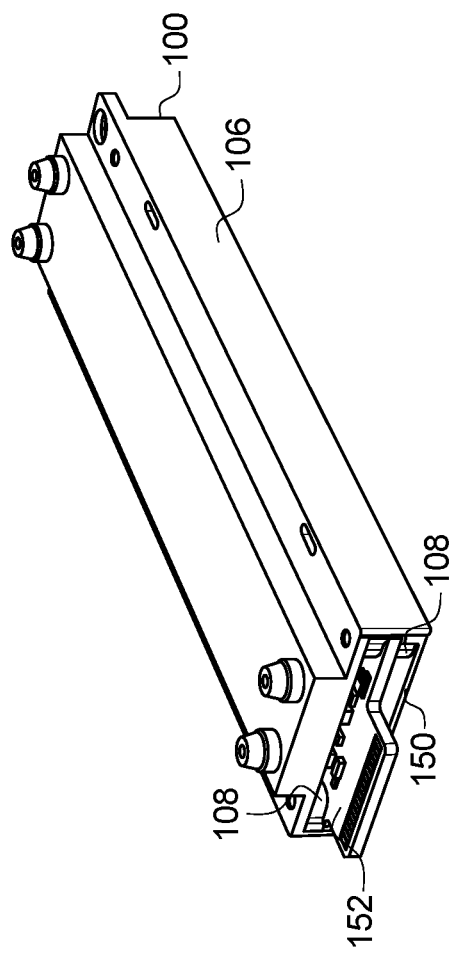
FIG. 18 is a top perspective view of a microchannel heat sink and SSD according to embodiments of the present technology.

FIGS. 17-19 show the heat sink 100 in conjunction with an electronic device 150. FIG. 17 is a perspective view with the heat sink 100 positioned above the electronic device 150, and FIGS. 18 and 19 are perspective and cross-sectional views, respectively, of the heat sink affixed to the electronic device. In embodiments, the electronic device 150 may be an SSD, comprising a printed circuit board (PCB) 152 having solid state memory devices 154 formed on one or both opposed surfaces of the PCB. The brackets 108 of the heat sink 100 align with holes in the PCB 152, so that screws may fit through the brackets and the holes in the PCB to affix the heat sink around the SSD 150. As seen, the ribs 106 are spaced from each other so as to fit down around the sides of the SSD 150 so that the heat sink can absorb heat from the SSD from a top surface of the SSD and at the sides of the SSD. While the figures show the example of an SSD, it is understood that the heat sink 100 of the present technology may be used to cool other electronic devices, both within datacenters and in other applications outside of a datacenter. In embodiments, the electronic device may be a rotating disk hard drive or other electronic devices that generate heat.

In operation, an external pump (not shown) with tubing is connected to the two inlet fittings 110a, 112a and two outlet fittings 110b, 112b. The conical shape of the inlets/outlets allows the tubing to be tightened gradually as it is pushed towards microchannel base 102. As noted, each inlet/outlet fitting may include an O-ring 114 which is 3D printed on the inlet/outlet fitting for a tight, leak-proof fit between the tubing and the inlets/outlets.

Once the tubing is attached, a cooling fluid may be pumped into inlet fitting 110a at a first side of the heat sink 100, and into inlet fitting 112a at the second, opposed side of the heat sink 100. In one example, the coolant may be a water and glycol mixture, and the inlet temperature of the coolant may be maintained at 25° C. It is understood that other types of coolant may be used, and the temperature of the coolant at inlets 110a, 112a may be greater or lesser than 25° C. As noted, each inlet/outlet fitting includes a wider base portion 126c, which acts as a temporary reservoir for the cooling fluid within the heat sink 100. Heat is absorbed by the coolant, through the microchannel base 102 and ribs 106, as the coolant moves through the microchannels 120, 122 and the heated coolant leaves the heat sink 100 through the outlet fittings 110b, 112b. The coolant may then be cooled and recirculated through the heat sink 100. A continuous coolant flow is ensured by the external pump.

In embodiments, the flowrate of the coolant through each microchannel 120, 122 may range from 250 μl/min to 6 ml/min, though the flowrate may be higher or lower than this range in further embodiments. In embodiments, the heat sink 100 may absorb up to 10 W (1 W/cm2) over the area of the microchannel base 102 and ribs 106.

In summary, in one example, the present technology relates to a heat sink for cooling an electronic device, comprising: a thermally conductive base having a surface configured to lie adjacent the electronic device, the thermally conductive base configured to draw heat away from the electronic device; first and second inlet fittings configured to receive cooling fluid into the heat sink; first and second outlet fittings configured to expel cooling fluid from the heat sink; first and second microchannels connected between the first inlet fitting and the first outlet fitting, the first microchannel spaced a first distance from the surface of the thermally conductive base, and the second microchannel spaced a second distance from the surface of the thermally conductive base, the first distance being greater than the second distance; and third and fourth microchannels connected between the second inlet fitting and the second outlet fitting, the third microchannel spaced a third distance from the surface of the thermally conductive base, and the fourth microchannel spaced a fourth distance from the surface of the thermally conductive base, the third distance being greater than the fourth distance.

In a further embodiment, the present technology relates to a heat sink for cooling an electronic device, comprising: a thermally conductive base having first and second ends, and a surface extending between the first and second ends and configured to lie adjacent the electronic device, the thermally conductive base configured to draw heat away from the electronic device; a first inlet fitting adjacent the first end of the thermally conductive base configured to receive cooling fluid into the heat sink; a second inlet fitting adjacent the second end of the thermally conductive base configured to receive cooling fluid into the heat sink; a first outlet fitting adjacent the second end of the thermally conductive base configured to expel cooling fluid from the heat sink; a second outlet fitting adjacent the first end of the thermally conductive base configured to expel cooling fluid from the heat sink; first and second microchannels extending between the first inlet and the first outlet; and third and fourth microchannels extending between the second inlet and the second outlet.

In another embodiment, the present technology relates to a heat sink for cooling an electronic device, comprising: a thermally conductive base having first and second ends, and a surface extending between the first and second ends and configured to lie adjacent the electronic device, the thermally conductive base configured to draw heat away from the electronic device; first inlet means adjacent the first end of the thermally conductive base for receiving cooling fluid into the heat sink; second inlet means adjacent the second end of the thermally conductive base for receiving cooling fluid into the heat sink; first outlet means adjacent the second end of the thermally conductive base for expelling cooling fluid from the heat sink; second outlet means adjacent the first end of the thermally conductive base configured to expel cooling fluid from the heat sink; first fluid flow means extending between the first inlet means and the first outlet means for conducting a cooling fluid between the first inlet means and the first outlet means; and second fluid flow means extending between the second inlet means and the second outlet means for conducting a cooling fluid between the second inlet means and the second outlet means.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A heat sink for cooling an electronic device, comprising:
    a thermally conductive base having a surface configured to lie adjacent the electronic device, the thermally conductive base configured to draw heat away from the electronic device;
    first and second inlet fittings configured to receive cooling fluid into the heat sink;
    first and second outlet fittings configured to expel cooling fluid from the heat sink;
    first and second microchannels connected between the first inlet fitting and the first outlet fitting, the first microchannel spaced a first distance from the surface of the thermally conductive base, and the second microchannel spaced a second distance from the surface of the thermally conductive base, the first distance being greater than the second distance; and
    third and fourth microchannels connected between the second inlet fitting and the second outlet fitting, the third microchannel spaced a third distance from the surface of the thermally conductive base, and the fourth microchannel spaced a fourth distance from the surface of the thermally conductive base, the third distance being greater than the fourth distance;
    wherein one of the first and second microchannels angles inward from the first inlet and first outlet toward a longitudinal centerline of the thermally conductive base in a plane parallel to the surface of the thermally conductive base.

2. The heat sink of claim 1, the heat sink further comprising side ribs, extending at right angles to the surface of the thermally conductive base, the side ribs configured to fit down over opposed sides of the electronic device.

3. The heat sink of claim 1, wherein one or more of the first, second, third and fourth microchannels have a triangular cross-section.

4. The heat sink of claim 3, wherein the one or more of the first, second, third and fourth microchannels have a surface roughness of between 3-25 μm.

5. The heat sink of claim 1, wherein the first distance equals the third distance.

6. The heat sink of claim 1, wherein second distance equals the fourth distance.

7. The heat sink of claim 1, wherein one of the first and second microchannels is a straight channel extending between the first and second inlets.

8. The heat sink of claim 1, wherein one or more of the first and second inlet fittings and first and second outlet fittings has a wider base nearest the surface of the thermally conductive base, the wider base configured to act as a reservoir for cooling fluid.

9. The heat sink of claim 1, wherein the electronic device is a solid state memory device in a datacenter.

10. The heat sink of claim 1, wherein the heat sink is formed by additive manufacturing.

11. A heat sink for cooling an electronic device, comprising:
- a thermally conductive base having first and second ends, and a surface extending between the first and second ends and configured to lie adjacent the electronic device, the thermally conductive base configured to draw heat away from the electronic device;
- a first inlet fitting adjacent the first end of the thermally conductive base configured to receive cooling fluid into the heat sink;
- a second inlet fitting adjacent the second end of the thermally conductive base configured to receive cooling fluid into the heat sink;
- a first outlet fitting adjacent the second end of the thermally conductive base configured to expel cooling fluid from the heat sink;
- a second outlet fitting adjacent the first end of the thermally conductive base configured to expel cooling fluid from the heat sink;
- first and second microchannels extending between the first inlet and the first outlet; and
- third and fourth microchannels extending between the second inlet and the second outlet;
- wherein one of the first and second microchannels angles inward from the first inlet and first outlet toward a longitudinal centerline of the thermally conductive base in a plane parallel to the surface of the thermally conductive base.

12. The heat sink of claim 11, wherein one or more of the first, second, third and fourth microchannels have a triangular cross-section.

13. The heat sink of claim 12, wherein the one or more of the first, second, third and fourth microchannels have a surface roughness of between 3-25 μm.

14. The heat sink of claim 11, wherein the first and second microchannels are formed through the thermally conductive base at different distances away from the surface of the thermally conductive base.

15. The heat sink of claim 14, wherein the third microchannel is formed at a same distance away from the surface of the thermally conductive base as the first microchannel.

16. The heat sink of claim 11 wherein the one of the first and second microchannels that does not angle inward is a straight channel extending between the first inlet and the first outlet.

17. The heat sink of claim 11, wherein the heat sink is formed by additive manufacturing.

18. A heat sink for cooling an electronic device, comprising:
- a thermally conductive base having first and second ends, and a surface extending between the first and second ends and configured to lie adjacent the electronic device, the thermally conductive base configured to draw heat away from the electronic device;
- first inlet means adjacent the first end of the thermally conductive base for receiving cooling fluid into the heat sink;
- second inlet means adjacent the second end of the thermally conductive base for receiving cooling fluid into the heat sink;
- first outlet means adjacent the second end of the thermally conductive base for expelling cooling fluid from the heat sink;
- second outlet means adjacent the first end of the thermally conductive base configured to expel cooling fluid from the heat sink;
- first fluid flow means extending between the first inlet means and the first outlet means for conducting a cooling fluid between the first inlet means and the first outlet means; and
- second fluid flow means extending between the second inlet means and the second outlet means for conducting a cooling fluid between the second inlet means and the second outlet means;
- wherein one of the first and second fluid flow means angles inward from the first inlet means and first outlet means toward a longitudinal centerline of the thermally conductive base in a plane parallel to the surface of the thermally conductive base.

* * * * *